United States Patent
Boxall et al.

(10) Patent No.: US 8,946,088 B2
(45) Date of Patent: Feb. 3, 2015

(54) METHOD OF METAL DEPOSITION

(71) Applicant: Lancaster University Business Enterprises Limited, Bailrigg (GB)

(72) Inventors: Colin Boxall, Lancaster (GB); Michael Bromley, Lancaster (GB)

(73) Assignee: Lancaster University Business Enterprises Limited, Bailrigg (GB)

( * ) Notice: Subject to any disclaimer, the term of this patent is extended or adjusted under 35 U.S.C. 154(b) by 0 days.

(21) Appl. No.: 13/852,246

(22) Filed: Mar. 28, 2013

(65) Prior Publication Data

US 2013/0217227 A1    Aug. 22, 2013

Related U.S. Application Data

(63) Continuation of application No. PCT/GB2011/001402, filed on Sep. 28, 2011.

(30) Foreign Application Priority Data

Oct. 1, 2010 (GB) .................................. 1016521.5

(51) Int. Cl.
*H01L 21/44* (2006.01)
*H01L 21/02* (2006.01)
(Continued)

(52) U.S. Cl.
CPC .......... *H01L 21/02697* (2013.01); *C23C 18/14* (2013.01); *C23C 18/1601* (2013.01);
(Continued)

(58) Field of Classification Search
None
See application file for complete search history.

(56) References Cited

U.S. PATENT DOCUMENTS 2,532,283 A   12/1950  Brenner et al.
4,388,351 A *  6/1983  Sawyer .................. 427/304
(Continued)

FOREIGN PATENT DOCUMENTS

JP    S60155678 A    8/1985
JP      6210393 A    5/1987
(Continued)

OTHER PUBLICATIONS

Liu, "A simple, template-free route for the synthesis of mesoporous titaium dioxide materials", J. Mater. Chem., 2004, 14, 1187-1189.
(Continued)

*Primary Examiner* — Cheung Lee
(74) *Attorney, Agent, or Firm* — Woodard, Emhardt, Moriarty, McNett & Henry LLP

(57) ABSTRACT

A method of forming a metal layer on an electrically insulating substrate comprises depositing a photocatalyst layer onto the substrate and depositing a mask layer comprising voids on the substrate, such as a layer of latex microparticles with voids between them, to give an open pore structure to the mask. An electroless plating solution is then provided on the photocatalyst layer, and the photocatalyst layer and electroless plating solution are illuminated with actinic radiation whereby deposition of metal from the electroless plating solution to form a metal layer on the photocatalyst layer is initiated whereby the metal deposits in the voids of the mask layer. The mask layer is subsequently removed to leave a porous metal layer on the substrate. The method allows for deposition of porous metal films with controlled thickness and excellent adhesion onto electrically insulating substrates. The method is suitable for providing metal layers with controlled, regular porosity.

14 Claims, 1 Drawing Sheet

(51) Int. Cl.
  *C23C 18/14* (2006.01)
  *C23C 18/16* (2006.01)
  *C23C 18/18* (2006.01)
  *C23C 18/31* (2006.01)
  *C23C 18/44* (2006.01)

(52) U.S. Cl.
  CPC ......... *C23C18/1603* (2013.01); *C23C 18/1605* (2013.01); *C23C 18/1642* (2013.01); *C23C 18/1648* (2013.01); *C23C 18/1667* (2013.01); *C23C 18/1851* (2013.01); *C23C 18/31* (2013.01); *C23C 18/44* (2013.01)
  USPC .................. 438/678; 438/686; 257/21.174

(56) References Cited

U.S. PATENT DOCUMENTS

| | | | |
|---|---|---|---|
| 5,314,725 | A | 5/1994 | Morishita |
| 6,203,925 | B1 | 3/2001 | Attard et al. |
| 7,067,237 | B2 | 6/2006 | Kim et al. |
| 2006/0019076 | A1 | 1/2006 | Kim et al. |
| 2007/0222079 | A1 | 9/2007 | Ohta |

FOREIGN PATENT DOCUMENTS

| | | |
|---|---|---|
| JP | H07118863 A | 5/1995 |
| JP | 2001011644 A | 1/2001 |
| JP | 2001107257 A | 4/2001 |
| JP | 2002205388 A | 7/2002 |
| JP | 2004190109 A | 7/2004 |
| JP | 2009081244 A | 4/2009 |
| KP | 20070082945 | 8/2007 |
| KP | 100773402 | 11/2007 |
| WO | WO 9900536 A2 | 1/1999 |
| WO | 2009/036454 A2 | 3/2009 |

OTHER PUBLICATIONS

Search Report for GB1016521.5, Jun. 16, 2011, 5 pgs.

\* cited by examiner

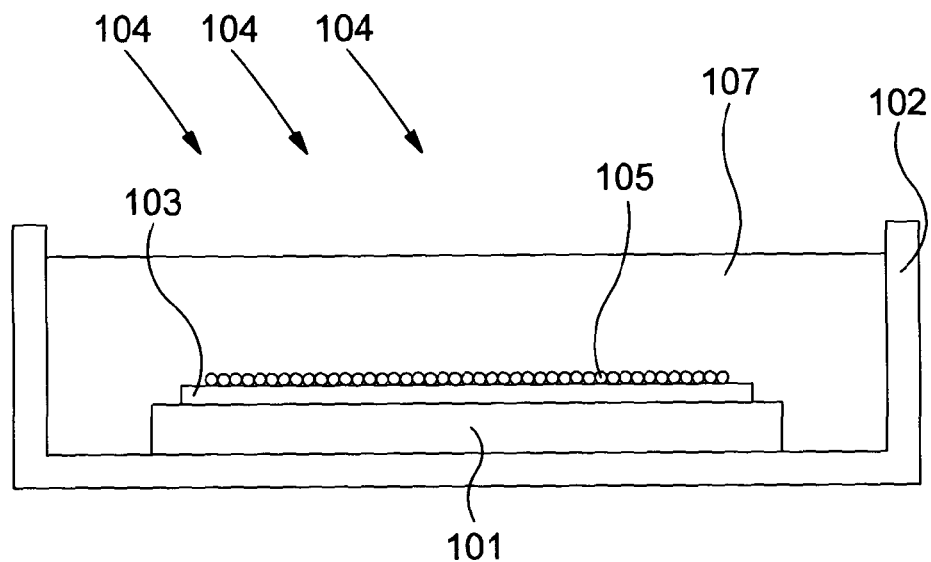

METHOD OF METAL DEPOSITION

CROSS-REFERENCE TO RELATED APPLICATIONS

This application is a continuation of Application No. PCT/GB2011/001402, filed Sep. 28, 2011, which claims foreign priority to GB 1016521.5, filed Oct. 1, 2010 which are hereby incorporated by reference in their entirety.

FIELD

The present invention is concerned with methods of depositing metal onto substrates from an electroless plating solution. In particular, it relates to the deposition of metal layers, particularly porous metal layers, onto insulating substrates.

BACKGROUND

Substrates having one or more metal layers deposited on one or more of their surfaces have many industrial uses. For instance, insulating films having a metal layer or layers on one or more surfaces are of use in separation processes, fuel cells, super-capacitors, electrolytic cells for splitting water into hydrogen and oxygen, and for catalysis.

Electroplating (also known as electro-deposition) is a well known industrial process that uses electrical current to reduce ionic precursors of a desired material (usually a metal) from a solution (aqueous or non-aqueous) in order to coat a conductive substrate with a layer of the desired material. The electrically conductive substrate may be suitably used as one of the electrodes in an electrochemical cell whereby the electrical current causing electroplating is provided, effecting the electroplating. U.S. Pat. No. 6,203,925 (Attard et. al.) and international patent application Publication WO 99/00536 (Bartlett et al) disclose the production of porous metal films on electrically conducting substrates by electro-deposition from a liquid crystalline phase.

publication U.S. Pat. No. 2,532,283 (Brenner & Riddell) discloses electroless plating. Electroless plating is an auto-catalytic reaction used to deposit a coating of a desired material (usually a metal) from an electroless plating solution (usually an aqueous solution) onto a substrate (usually a conducting substrate). In contrast to electroplating, electroless plating does not require application of an electric current. Instead, deposition proceeds as a chemical reaction at the surface of the substrate.

Once deposition by electroless plating has been initiated, the electroless reaction is typically self-sustaining until either: a) the electroless plating solution is exhausted, b) the substrate is removed from the electroless plating solution, or c) the composition of the solution is adjusted to terminate plating. Electroplating is suitable for use with electrically conducting substrates. Electroless plating offers the advantage of allowing deposition of material by plating onto electrically insulating substrates.

Prior electroless plating methods require substantial preparation of the substrate prior to commencement of plating. Typically, prior to commencement of electroless plating, a catalytic metal such as palladium is first deposited onto the substrate as a seed or nucleation layer, most usually in a two step process, for example: i) priming of the substrate with an acidic tin chloride solution is carried out, this resulting in adsorption of $Sn^{2+}$ ions onto the surface from the solution to provide a primed surface; ii) treatment of the primed surface with a solution of palladium chloride in hydrochloric acid whereby $Sn^{2+}$ ions adsorbed in step (i) reduce Pd(II) ions in solution to form deposits of metallic Pd on the substrate surface.

These Pd deposits subsequently act as nucleation sites during electroless plating of the desired metal, which may be Pd or which may be a different metal. It is also known, in the prior art, to combine the metal ions for priming and those used for providing nucleation sites on the surface to be treated in a single pre-treatment solution. This may result in initial adsorption of Sn—Pd particles onto the surface of the substrate, with the tin subsequently removed by treatment with concentrated hydrochloric acid to leave palladium deposits on the surface to act as nucleation sites for electroless deposition. However, irrespective of which pre-preparation method is used to provide a substrate ready for electroless deposition, the pre-preparation method may have to be repeated up to ten times in order to achieve a surface adequately modified to act as a template for electroless deposition.

This is both costly and time consuming. Also, lengthy surface preparation, involving cleaning, etching and neutralising, may be required, prior to electroless plating and/or prior to pre-treatment. This is in order to promote adhesive bonding of the electroless metal layer to the substrate surface upon which it is deposited. Furthermore, the resulting metal deposit, generated by electroless plating, will contain Pd and may include Sn, this latter metal being a particularly troublesome and undesirable impurity if the substrate upon which the metal layer has been deposited is for subsequent use in electrochemical applications.

Photocatalytic deposition of metals onto semiconductors is a mature technology in the prior art. In particular, titanium dioxide is known as a photocatalyst for use in the reductive deposition of noble metals such as palladium and platinum onto semiconductor surfaces. During irradiation of titanium dioxide, using actinic radiation such as ultra-violet radiation having a photon energy in excess of the band gap of the titanium dioxide, electrons may be excited and drive redox reactions, catalysed by the titanium dioxide particles and leading to deposition of metal from a treatment solution onto the semiconductor surface.

However, such processes typically result in either:
a) a layer of deposited nano-particles of metal with a granular structure and highly disordered porosity, or
b) a coherent monolayer of metal, the formation of which results in cessation of the plating process once the surface and its photocatalyst layer are masked.
There is no control of layer thickness afforded in either instance.

It is also known to use photo-catalysis such as titanium dioxide in etching of surfaces as well as deposition. U.S. Pat. No. 7,067,237 and US patent application publication 2006-0019076-A disclose modification of surfaces using a photocatalyst followed by electroless deposition onto the modified surface. The processes disclosed in these documents comprise separate, discrete process steps for photoexcitation, primer metal nucleation and then electroless metal deposition.

Hence, there is a need for electroless methods of deposition of metal layers onto substrates which obviate the complex substrate treatment regimes required in the prior art and which eliminate the need for primer or nucleation metals to be present in or below deposited layers.

SUMMARY OF THE INVENTION

It is one object of the invention, amongst others, to provide electroless methods of deposition of metal layers onto electrically insulating substrate surfaces which obviate the complex substrate treatment regimes required in the prior art. In particular, it is an object of the invention to provide methods which do not require deposition of primer or nucleation metals prior to electroless deposition. It is a further object of the invention to provide methods which ensure that the metal layers deposited are strongly adhered to the substrate surface upon which they are formed. It is a further object of the invention to provide methods for deposition of porous metal layers onto substrate surfaces. Another object of the invention is to provide methods for depositing metal layers wherein the thickness of the deposited metal layer is easily controllable during the deposition method. A further object of the invention is to provide simpler methods than those of the prior art, for instance requiring fewer process steps or obviating the need for deposition of a primer metal onto a surface prior to electroless deposition of a metal.

The invention provides, in a first aspect, a method of forming a porous metal layer on an electrically insulating substrate, the method comprising:

a) depositing a photocatalyst layer onto the substrate,
b) depositing a mask layer comprising voids, on the photocatalyst layer,
c) providing an electroless plating solution on the mask layer and photocatalyst layer,
d) illuminating the photocatalyst layer, mask layer and electroless plating solution with actinic radiation whereby deposition of metal from the electroless plating solution to form a metal layer on the photocatalyst layer is initiated, whereby deposition of the metal occurs within the voids, and
e) removing the mask layer following deposition of the metal to provide a porous metal layer.

In a second aspect, the invention provides a method of forming a porous metal layer on a substrate, the method comprising:

a) depositing a mask layer comprising voids on the substrate, wherein the mask layer is a layer of microparticles, the voids being the spaces between the microparticles,
b) depositing metal onto the substrate, whereby the metal deposits in the voids of the mask layer, and
c) removing the mask layer to leave a porous metal layer on the substrate, wherein the metal is deposited by electroless plating from an electroless plating solution.

BRIEF DESCRIPTION OF THE DRAWINGS

FIG. 1 is a cross-sectional view through a substrate prepared for metal deposition.

DETAILED DESCRIPTION OF THE INVENTION

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components, where % weight is used to define a composition. Where $g/dm^3$ is used to define levels of components in a composition, the composition consisting essentially of a set of components will typically comprise less than 50 $g/dm^3$, typically less than 30 $g/dm^3$, more typically less than 10 $g/dm^3$ of non-specified components.

Whenever appropriate, the use of the term "comprises" or "comprising" may also be taken to include the meaning "consists essentially of" or "consisting essentially of", or "consisting of".

By actinic radiation is meant radiation, typically electromagnetic radiation, capable of inducing chemical reaction when used to illuminate the photocatalyst layer. Typically, the actinic radiation will be ultraviolet radiation.

The method of the first aspect of the invention comprises, in step (a), depositing a photocatalyst layer onto the substrate. The photocatalyst layer comprises or consists essentially of a photocatalyst, for instance titanium dioxide or the like, for instance in particulate form, which is capable of inducing reductive deposition of a metal from an electroless plating solution when suitably illuminated with actinic radiation. Suitably, the photocatalyst layer is deposited directly onto the substrate (i.e. without any binder or primer layer being used).

The photocatalyst layer may comprise any suitable photocatalyst which may typically be present as colloidal particles (having a volume mean particle size say from 1 to 1000 nm). The photocatalyst may comprise or consist essentially of a semiconductor, and suitably may comprise or consist essentially of a particulate semiconductor. For instance the photocatalyst may be selected from semiconducting single, binary and ternary metal oxides with bandgaps corresponding to photon energies in the visible, near and middle ultraviolet UV spectral regions (say 1.5 to 6.0 eV), or doped versions thereof, regardless of crystalline phase (e.g. for $TiO_2$-anatase, rutile or brookite may be employed) or of crystalline habit (spheres, needles, etc.). Suitably, the band gap may be 3.5 eV or less, such as 3.2 eV or less.

Examples of suitable semiconductor photocatalysts include; single metal oxides: $WO_3$, $SnO_2$, alpha and gamma $Fe_2O$, $TiO_2$, indium oxide, $BiVO_4$, $ZnO$; binary metal oxides: $BaTiO_3$, $SrTiO_3$, $FeTiO_3$; ternaries: $In_{0.9}Ni_{0.1}TaO_4$. Mixtures of such catalysts may also be used.

Preferably, the photocatalyst layer may comprise or consist essentially of titanium dioxide, suitable to act as photocatalyst for electroless deposition of metal. Preferably, the titanium dioxide may be in particulate form. The titanium dioxide may, for instance, be deposited onto the substrate surface as colloidal particles or as a mesoporous film, for instance prepared by sol-gel deposition, such as set out in J. Mater. Chem., 2004, 14, 1187-1189.

The method of the invention comprises, in step (b), depositing a mask layer comprising voids, the mask layer provided on the photocatalyst layer, whereby deposition of the metal occurs within the voids. The mask layer is removed (e.g. by its dissolution) in step (e), following deposition of the metal, whereby the metal layer is a porous metal layer.

The mask layer is a porous mask layer with voids forming the pore space of the mask layer and may be formed or provided by any suitable method. The porous mask layer is deposited on the substrate prior to application of the electroless plating solution in the subsequent process step (c). One method to form such a mask layer is to deposit a layer of microparticles, the voids being provided by the spaces between the microparticles. The mask layer is suitably of an open porous structure whereby the electroless plating solution is in fluid contact with the substrate through the open pore structure of the mask layer. Preferably, the layer of microparticles is substantially a monolayer when shallow, 2-dimensional porosity is required, allowing the electroless plating solution to efficiently contact the photocatalyst layer through voids between the microparticles, but may also be of 2 or more layers where 3-dimensional porosity is required. By microparticles is meant particles having a mean diameter (volume mean diameter as measured by light scattering particle sizing apparatus such as a Malvern Mastersizer™) from 50 to 1000 nm. The particle may have any shape but preferably may be spheroidal or more preferably substantially spherical in shape. The shape of the microparticles generates the shape of the resulting pores, after removal of the microparticles. Hence microparticles of different sizes and/or geometries may be suitably chosen to produce layers suitable for different applications.

Suitably, the microparticles may be polymer latex particles. These may be deposited from a latex solution onto the substrate surface on the photocatalyst layer to provide deposition of the mask layer. A suitable volume of latex solution to provide a substantial monolayer of microparticles may be used to provide the porous mask layer by depositing a calculated volume onto the substrate and evaporating the liquid to leave the latex particles deposited as a substantial monolayer on the surface. The volume of latex solution, or the latex concentration of that solution may be increased to a suitable level to produce multiple layers of microspheres on the surface.

Suitable polymers for the latex microparticles include polystyrene, natural or synthetic rubbers, polyethylene or the like, as are well known and readily commercially available.

Suitably, the microparticles may be substantially monodisperse in diameter.

As electroless deposition of metal from the electroless plating solution onto the photocatalyst layer is initiated and proceeds, metal is deposited in the voids of the mask layer and cannot form where the mask layer skeleton is present. For instance, for a layer of microparticles, the metal is deposited in the voids between the microparticles.

Once metal deposition has been stopped, for instance by exhaustion of the electroless plating solution or by removal of the substrate from the electroless plating solution, the mask layer may be removed, for instance by dissolution using a suitable solvent, whereby a porous metal layer is left deposited on the substrate surface, the pore space of the metal layer being formed by voids left behind when the mask layer is dissolved and removed.

In step (c), an electroless plating solution is provided on the photocatalyst layer, on the substrate. The electroless plating solution may be any suitable electroless plating solution. Suitably, an aqueous solution may be used, meaning that the electroless plating solution comprises at least 700 g/dm$^3$ by weight of water in addition to other components making up the balance of the electroless plating solution.

Details of electroless plating methods and solutions are found in "Electroless plating: fundamentals and applications"—Mallory and Hadju—1990.

Other components of the electroless plating solution may include a metal salt, typically from 0.5 to 20 g/dm$^3$ of metal salt, for instance from 1 to 10 g/dm$^3$, say from 1 to 5 g/dm$^3$. The metal salt or precursor is a source of ions for the metal to be deposited, such as silver nitrate for silver deposition or palladium chloride for palladium deposition. There may also be included a complexant, such as a chelating agent, for instance ethylenediamine, EDTA (ethylene diamine tetraacetic acid)di-sodium salt or the like. The complexant may suitably be present at a level from 1 to 200 g/dm$^3$, for instance from 2 to 100 g/dm$^3$. Stabiliser such as 3,5 di-iodotyrosine, ammonium hydroxide or the like may also be included. This stabiliser may be typically at a level from 0.001 to 150 g/dm$^3$.

The role of the complexant and/or stabiliser is to stabilise the electroless plating solution by reducing the concentration of free metal ions, preventing or reducing precipitation of undesirable basic metal salts and also may act as a buffer to prevent rapid decrease in pH as electroless plating progresses.

A further ingredient which may be present in the electroless plating solution is a reducing agent, reductant and/or scavenger such as potassium sodium tartrate, hydrazine or the like. The scavenger is a hole scavenger and may be the same chemical as the reducing agent or reductant. The reducing agent acts as electron donor for the auto-catalytic stage of metal reduction. Other examples of suitable reducing agents include sodium hypophosphite and ethanol. Typically these may be present at a level from 0.5 to 50 g/dm$^3$, say 0.6 to 15 g/dm$^3$.

By hole scavenger is meant a compound which donates electrons to fill in hole-type (as opposed to electron) conductors which may form on photocatalysts such as $TiO_2$ upon photoexcitation of electrons. The use of a hole scavenger may enhance the capability of the photocatalyst to reduce the metal ions and make them more available in solution. If holes remain un-scavenged, an electron accumulation layer may form, inhibiting further deposition.

Step (d) involves illuminating the photocatalyst layer and electroless plating solution with actinic radiation whereby deposition of metal from the electroless plating solution to form a metal layer on the photocatalyst layer is initiated.

The actinic radiation is typically ultraviolet radiation. For instance the ultraviolet radiation has a photon energy sufficient to excite electrons across the band gap of the photocatalyst whereby reduction reactions are catalysed.

The deposition of the metal onto the photocatalyst layer means that a layer of the metal is deposited onto the substrate, on the photocatalyst layer. Steps (a), (b), (c) and (d) are applied sequentially but other steps may be carried out between them. Once the deposition of metal from the electroless plating solution has been initiated, it may then continue auto-catalytically in the absence of further illumination with suitable actinic radiation. The deposition of metal within the voids may be self-sustaining following initiation by illumination with actinic radiation. The deposition of metal within the voids may be sustained by electroless deposition to achieve a desired or required thickness.

The method of the invention may be used in selective deposition of metal layers onto different parts of a substrate surface, so that some portions of a substrate are provided with a metal layer, and other parts are free of deposited metal.

For instance the method of the invention may comprise selecting a first portion of surface upon which the metal layer is formed and a second portion which remain free of metal layer by illuminating the first portion but not the second portion with the actinic radiation.

In another embodiment, the method of the invention may comprise selecting a first portion of surface upon which the metal layer is formed and a second portion which remains free of metal layer by depositing the photocatalyst layer on the first portion and no photocatalyst layer on the second portion.

The method of the invention is for use with a substrate of an electrically insulating material, as electroless deposition does not require an electrically conductive substrate. By electrically insulating is meant a material having a conductivity of less than 1 S·m$^{-1}$.

The metal may suitably be silver or palladium. Electroless plating of these methods is known in the prior art and electroless plating solutions are readily available.

In a second aspect, the invention provides a method of forming a porous metal layer on a substrate, the method comprising:

a) depositing a mask layer comprising voids on the substrate, wherein the mask layer is a layer of microparticles, the voids being the spaces between the microparticles, b) depositing metal onto the substrate, whereby the metal deposits in the voids of the mask layer, and c) removing the mask layer to leave a porous metal layer on the substrate, wherein the metal is deposited by electroless plating from an electroless plating solution.

As with the first aspect of the invention, the substrate may be an electrically insulating substrate.

For the avoidance of doubt, the optional features set out for the first aspect of the invention are also applicable, where appropriate, to the second aspect of the invention.

Specific embodiments of the invention will now be described further by reference to the following, non-limiting examples. Reference will also be made to the accompanying FIG. 1 which shows a schematic cross sectional view section through a substrate prepared for metal deposition using an embodiment of the method of the first aspect of the invention.

EXAMPLES

All reagents used were AnalaR™ grade or better, and purchased from Sigma Aldrich, Gillingham, Dorset, UK. All water used was Ultrapure from a Direct-Q 3 UV Millipore water purification system (Millipore (U.K.) Limited, Watford, UK) to a resistivity of 18.2 MΩ·cm. The PVDF (polyvinylidene fluoride) membranes were purchased from Millipore, the pore size was 200 nm.

A) Deposition of Titanium Dioxide Photocatalyst onto Glass Slides by Spin Coating:

Mesoporous films of colloidal titanium dioxide were prepared using a modified reverse micellar sol-gel method. Firstly, triton X-100 (26 g) and cyclohexane (150 ml) were mixed to form the reverse micellar solution. Water (1.08 g), titanium isopropoxide (23 g) and acetylacetone (10 ml) were added. The resultant sol-gel was applied to substrates by spin-coating for 5 seconds at 2900 rpm. The substrates were then fired in a furnace at 770 K for 1 hour. The substrates were stored in the dark at room temperature before use.

B) Deposition of Titanium Dioxide Photocatalyst onto Glass Slides by Dip-Coating:

A colloidal suspension of titanium dioxide was prepared by adding 0.3258 g of titanium dioxide powder (commercial grade P25 ex Degussa) to 40 ml of deionised distilled water. After vigorous shaking the solution was sonicated for 200 seconds at an amplitude of 6 micrometers using a cycle of 10 seconds on and 10 seconds off. The sonicator used was an MSE Soniprep 150. The substrates were then dip-coated manually in the colloidal suspension and allowed to dry under ambient conditions. The coating/drying cycle process was repeated 5 times. The coated substrates were stored in the dark at room temperature before use.

C) Deposition of Titanium Dioxide Photocatalyst onto PVDF Membrane by Dip-Coating:

PVDF membrane (Millipore UK) with pore size 200 nanometers was manually dip-coated twice in a nanoparticulate titanium dioxide/methanol suspension. The titanium dioxide particles (Sigma Aldrich, UK, particle diameter=25-75 nm) constituted 2 per cent by weight of the suspension with the balance being methanol. Before each coating step, the solution was sonicated (MSE Soniprep 150 sonicator), for 2 minutes at 6 micrometer amplitude and the coated layer was allowed to dry before re-coating. The final coated substrate was then allowed to dry for 1 hour in the dark before use.

D) Depositing a Mask Layer by Deposition of Microparticles:

Polystyrene microspheres of 1 micron diameter (ex Alfa Aesar) as a 2.5 wt % suspension in water were used as microparticles. For preparation purposes this commercial latex was further diluted to 1.0 wt % with distilled water to form a microparticle suspension.

Substrates comprising a photocatalyst layer prepared according to examples A, B or C as set out above were further prepared for deposition of the microparticles by irradiating with UV light for 60 minutes. This was to ensure that the photocatalyst layer has a hydrophilic surface in order to facilitate deposition of the microparticles as a close packed array.

A tapered PTFE ring was adhered to the photocatalyst layer on the substrate surface with silicone grease, to provide a seal impermeable to liquid leakage. The substrate was then placed on a level surface to prevent gravitational bias in deposition of microparticles. Where monolayer microparticle coverage was required, the amount of microparticle suspension deposited into the ring was calculated to ensure a substantial monolayer of microparticles using the following equation:

$$\text{Quantity of 1.0 wt \% suspension (µl)} = \text{Area (mm}^2\text{)} \times 0.13.$$

Following application of the microparticle suspension, substrates were left undisturbed for 12 hours in an enclosed environment to ensure that evaporation is not accelerated by air currents. Once the water had evaporated, the PTFE ring was removed and the substrate with photocatalyst layer and mask layer (monolayer of microparticles) was ready for deposition of metal by electroless plating.

Turning to FIG. 1, this shows a substrate 101 having a photocatalyst layer 103 and a mask layer of microparticles 105 placed into an electroless plating solution 107 in vessel 102 for deposition of the metal layer. The microparticles 105 may be in a random or preferably in an ordered, close-packed arrangement. Actinic (UV/visible) radiation 104 is shone onto the substrate 101 through the electroless plating solution 107 to initiate deposition of metal. Examples of plating solutions are given below in Tables 1 and 2.

Electroless silver plating solutions were prepared to the composition given in Table 1. All components were added to a small quantity of distilled water in the order listed, ensuring full dissolution with each addition. The completed solution was made up to volume with distilled water and purged with nitrogen for 20 minutes to deoxygenate it. The pH of the solution was 11.5 and photo-initiated electroless deposition was carried out at 298 K. Electroless plating solutions were freshly made immediately prior to use. As silver nitrate is light sensitive, silver nitrate solutions were prepared and stored in amber flasks in darkness.

TABLE 1

Composition of silver electroless plating solution.

| Role | Component | Concentration |
|---|---|---|
| Metal precursor | Silver Nitrate | 1.496 g dm$^{-3}$ (8.8 mmol dm$^{-3}$) |
| Complexant | Ethylenediamine | 3.245 g dm$^{-3}$ |
| Stabiliser | 3,5-diiodotyrosine | 0.0017 g dm$^{-3}$ |
| Reducing agent/ scavenger | Potassium Sodium Tartrate | 0.7356 g dm$^{-3}$ |
| pH | | 11-12 |

Electroless palladium plating solutions were prepared to the composition given in Table 2. Palladium chloride, disodium EDTA and ammonium hydroxide (28% by weight ammonia in water) were added and, to ensure formation of a Pd-amine complex, stirred with gentle heating until the solution cleared. The resulting clear solution was cooled and hydrazine reducing agent added. The solution was then made up to volume with distilled water and purged with nitrogen for 20 mins. The electroless plating solution was prepared immediately before use.

TABLE 2

Composition of palladium electroless plating solution.

| Role | Component | Concentration |
|---|---|---|
| Metal precursor | Palladium Chloride | 3.60 g dm$^{-3}$ |
| Complexant | Di-sodium EDTA | 62.4 g dm$^{-3}$ |
| Stabiliser | Ammonium Hydroxide | 350.0 ml dm$^{-3}$ (as 28 wt % ammonia solution) |
| Reducing agent/ scavenger | Hydrazine | 11.0 ml dm$^{-3}$ |
| pH | | 11-12 |

Each substrate, with its photocatalyst film as formed in examples A, B or C, was placed into the electroless plating solution and irradiated for 20 minutes with UV(B) light (wavelength 315 nm). After this irradiation time, a coherent, conducting layer of metal was produced, the thickness of which was controllable by selection of immersion time.

The metal layers formed were found to be highly adhesive to the substrate, and were found to be compliant with British Standard metal adhesion test BS EN ISO 2819:1995.

During photo-initiated electroless deposition, metal is deposited only on the part of the surface which is both coated with photo-catalyst and subjected to suitable actinic radiation. Virtually no deposition at all occurs in un-illuminated areas or in areas not coated with photo-catalyst. Consequently the area of deposition of metal layer may be demarcated using techniques such as; physically masking the deposition of the photo-catalyst to leave uncoated areas, physically masking part of the area previously prepared with photo-catalyst, optically masking part of the area illuminated to prevent illumination with actinic radiation, or selectively illuminating the area using a scanned beam of actinic radiation.

Once the substrate has been illuminated for about five minutes with the actinic radiation, electroless plating will have been sufficiently initiated for auto-catalytic plating then to continue, even in the absence of further illumination with actinic radiation, whereby a bright, reflective, coherent, conducting layer of metal may be formed.

In the case of PVDF membranes that have been dip-coated as set out above in example C, the opposed faces of the membrane may be provided with a metal layer simultaneously without through-plating of the pores of the membrane.

Following deposition of the metal layer, the microparticles may be dissolved in an appropriate solvent chosen to dissolve the microparticles but not the substrate. For these Examples, toluene was employed for dissolution of the mask layer of microparticles to leave a porous metal layer.

The invention provides a method for manufacturing metal films with controlled thickness and excellent adhesion on substrates, particularly electrically insulating substrates. The method is suitable for providing metal layers with controlled, regular porosity by use of a mask layer as set out hereinbefore.

What is claimed:

1. A method of forming a porous metal layer on an electrically insulating substrate, the method comprising:
    a) depositing a photocatalyst layer onto the substrate,
    b) depositing a mask layer comprising voids, on the photocatalyst layer, wherein the mask layer is a layer of microparticles in an ordered, close-packed arrangement, the voids being the spaces between the microparticles,
    c) providing an electroless plating solution on the mask layer and photocatalyst layer,
    d) illuminating the photocatalyst layer, mask layer and electroless plating solution with actinic radiation whereby deposition of metal from the electroless plating solution to form a metal layer on the photocatalyst layer is initiated, whereby deposition of the metal occurs within the voids, and
    e) removing the mask layer following deposition of the metal to provide a porous metal layer.

2. A method according to claim 1 wherein the layer of microparticles is substantially a monolayer.

3. A method according to claim 1 wherein the mask layer comprises 2 or more layers of microparticles.

4. A method according to claim 1 wherein the microparticles are polymer latex particles.

5. A method according to claim 1 wherein the microparticles are substantially monodisperse in diameter.

6. A method according to claim 1 wherein the photocatalyst layer comprises or consists essentially of a semiconductor material.

7. A method according to claim 1 wherein the photocatalyst layer comprises or consists essentially of particles of a semiconductor material.

8. A method according to claim 1 wherein the photocatalyst layer comprises or consists essentially of titanium dioxide.

9. A method according to claim 8 wherein the photocatalyst comprises or consists essentially of particles of titanium dioxide.

10. A method according to claim 1 wherein the actinic radiation is ultraviolet radiation.

11. A method according to claim 1 comprising selecting a first portion of surface upon which the metal layer is formed and a second portion which remains free of metal layer by illuminating the first portion but not the second portion with the actinic radiation.

12. A method according to claim 1 comprising selecting a first portion of surface upon which the metal layer is formed and a second portion which remains free of metal layer by depositing the photocatalyst layer on the first portion and no photocatalyst layer on the second portion.

13. A method according to claim 1 wherein the metal is silver or palladium.

14. A method of forming a porous metal layer on a substrate, the method comprising:
    a) depositing a mask layer comprising voids on the substrate, wherein the mask layer is a layer of microparticles in an ordered, close-packed arrangement, the voids being the spaces between the microparticles,
    b) depositing metal onto the substrate, whereby the metal deposits in the voids of the mask layer, and
    c) removing the mask layer to leave a porous metal layer on the substrate, wherein the metal is deposited by electroless plating from an electroless plating solution.

* * * * *